United States Patent
Coene (10) Patent No.: US 7,065,161 B2
(45) Date of Patent: *Jun. 20, 2006

(54) PARTIAL RESPONSE MAXIMUM LIKELIHOOD (PRML) BIT DETECTION APPARATUS

(75) Inventor: Willem M. J. Coene, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 48 days.

This patent is subject to a terminal disclaimer.

(21) Appl. No.: 10/454,128

(22) Filed: Jun. 4, 2003

(65) Prior Publication Data

US 2003/0194027 A1 Oct. 16, 2003

Related U.S. Application Data

(63) Continuation of application No. 09/399,609, filed on Sep. 20, 1999, now Pat. No. 6,580,766.

(30) Foreign Application Priority Data

Sep. 18, 1998 (EP) .............................. 98203146
Mar. 3, 1999 (EP) .............................. 99200606

(51) Int. Cl.
    *H03D 1/00* (2006.01)

(52) U.S. Cl. ....................... 375/341; 714/708
(58) Field of Classification Search ................ 375/341, 375/265, 263, 262, 340, 259, 260, 261, 267; 714/708, 699, 704

See application file for complete search history.

(56) References Cited

U.S. PATENT DOCUMENTS 5,430,744 A * 7/1995 Fettweis et al. ............ 714/795
5,717,717 A * 2/1998 Yang et al. .................. 375/232
6,289,059 B1 * 9/2001 Yamaguchi et al. ........ 375/341
6,580,766 B1 * 6/2003 Coene ......................... 375/341
6,587,520 B1   7/2003 Coene et al. ............... 375/341

FOREIGN PATENT DOCUMENTS

EP        0647036         4/1995

OTHER PUBLICATIONS

EP 0 647 036 A (IBM) Apr. 5, 1995 p. 4, line 23–p. 4, line 35 p. 7, line 13–p. 8, line 14; figure 5.

B.H. Marcus, P.H. Siegel & J.K. Wolf: "Finite–State Modulation Codes for Data Storage" IEEE Journal on Selected Areas in Communications, vol. 10 No. 1, Jan. 1992 pp. 5–37, XP000462064 New York p. 19, column 2, line 25–p. 22, column 1, line 18; figure 18.

* cited by examiner

*Primary Examiner*—Kevin Burd
(74) *Attorney, Agent, or Firm*—Michael E. Belk (57) ABSTRACT

Sample values of an input information signal are obtained at sampling instants. For each of a plurality of states at a sampling instant, an optimum path metric value is determined. For each of the plurality of states a best predecessor state at he directly preceding sampling instant is determined. A state at the sampling instant identifies a sequence of n subsequent bits, where n is larger than 3, and sequences of n subsequent bits having n−1 directly successive bits of the same binary value ar allocated to the same state. The best path is established from the state at the sampling instant having the lowest optimum path metric value, back in time towards a previous sampling instant via best predecessor states, established earlier for earlier sampling instants, to establish an optimum state at the previous sampling instant. Then at least one bit of the n bits of the sequence of bits corresponding to the established optimum state at the previous sampling instant is output.

13 Claims, 12 Drawing Sheets

PARTIAL RESPONSE MAXIMUM LIKELIHOOD (PRML) BIT DETECTION APPARATUS

This application is a continuation of copending application Ser. No. 09/399,609, filed Sep. 20, 1999, now U.S. Pat. No. 6580766 hereby incorporated in whole by reference.

The invention relates to a partial response maximum likelihood (PRML) bit detection for deriving a bit sequence from an input information signal. An input information signal is sampled at sampling instants $t_i$ so as to obtain sample values. The sampling frequency has a relationship with a bit frequency. For each of a plurality of States $S_j$ at a sampling instant, optimum path metric value $PM(s_j,t_i)$ is calculated. For each of the plurality of states, a best predecessor state is determined at the directly preceding sampling instant $t_{i-1}$. A state at the sampling instant identities a sequence of n subsequent bits.

The best path is established from the state at the sampling instant $t_i$ having the lowest optimum path metric value, back in time towards a previous sampling instant $t_{i-N}$ via best predecessor states, established earlier for earlier sampling instants, to establish an optimum state at the previous sampling instant $t_{i-N}$. At least one it is output of the n bits of the sequence of bits corresponding to the established optimum state at the samplings instant $t_{i-N}$. The calculating determining, establishing and outputting is repeated for a subsequent sampling instant ti+1.

The PRML bit detection apparatus is based on a finite state machine with states corresponding to specific n-bit sequences.

Earlier filed EP patent application no. 98203146.0, having a filing date of 18.09.98 (PHN 17088), describes an apparatus for deriving amplitude values for such PRML bit detection apparatus. The amplitudes are derived from an input information signal, which amplitude values can be used as reference levels for the states of a finite state machine, which are needed for the computation of the likelihood functional in the said partial response maximum likelihood (PRML) bit detection apparatus.

PRML detection requires reference amplitude-levels for each state in the corresponding finite-state-machine (FSM), from which the likelihood of different paths is computed, given the sampled signal waveform. The well known Viterbi-algorithm enables very efficient computation of the most likely path. Each state of an n-taps partial response (PR) corresponds with one of the possible n-bits environments as shown e.g. in FIGS. 1 and 2. In standard PRML detection, an equalizer setting is chosen so that a simple symmetrical partial response is realized in the nominal situation of zero tilt of the disc with respect to the laser beam, i.e. with simple integer-valued coefficients. That single equalizer may not be optimal in terms of timing recovery. In such case a solution with two equalizers can be implemented, with one equalizer for the timing recovery, and a second one to equalize to the partial response levels. The second one may be made adaptive so that channel fluctuations may be followed, if a robust control mechanism can be set-up, e.g. one that measures the obliqueness of the channel, e.g. from the eye-pattern, and transforms this into an adaptation of the tap-values of the equalizer. Non-linearities such as a systematic asymmetry between marks and non-marks (which can be runlength dependent) are also a problem to be dealt with and are not accounted for in standard PRML using a linear partial response.

The invention aims at providing an improved PRML bit detection apparatus, which has a lower complexity.

In accordance with the invention, apparatus for deriving a bit sequence from an input information signal is provided. An input receives the input information signal. A sampler samples, at a predetermined sampling frequency, the input information signal at sapling instants $t_i$ so as to the sample values of the input information signal at the sampling instants $t_i$, the sampling frequency having a relationship with a bit frequency.

A calculator calculates at a sampling instant $t_i$ for each of a plurality of states $(s_j,t_i)$. The sampling instant, an optimum path metric value $PM(s_j, t_i)$. The calculator also determines for each of the plurality of states a best predecessor state at the recently preceding sampling instant $t_{i-1}$ a. A state at the sampling instant identifying a sequence of n subsequent bits. The calculator establishes a best path from the state at the sampling instant $t_i$ having the lowest optimum path metric value, back in time towards the sampling instant $t_{i-N}$ via best predecessor states, established earlier for earlier sampling instants, to establish an optimum state at the sampling instant $t_{i-N}$. The calculator also outputs at least one bit of the n bits of the sequence of bits corresponding to the established optimum state at sampling instant $t_i$.

Finally the calculator repeats the calculating determining, establishing and outputting for a subsequent sampling instant $t_{i+1}$, In the invention, n is larger than 3, and sequences of n subsequent bits having n-1 directly successive bits of the same binary value are allocated to the same state.

In another aspect of the invention, apparatus for deriving a bit sequence from an input information signal, is provided. The apparatus includes an input for receiving the input information signal, and a sampler means for sampling, at a predetermined sampling frequency, the input information signal at sampling instants $t_i$ so as to obtain sample values of the input information signal at the sampling instants $t_i$. The sampling frequency has a relationship with a bit frequency. The apparatus also includes calculation apparatus for calculating at a sampling instant $t_i$ for each of a plurality of states $s_j$ at the sampling instant, an optimum path metric value $PM(s_j,t_i)$ and for determining for each of the plurality of states a best predecessor state at the directly preceding sampling instant $t_{i-1}$. A state at the sampling instant identifies a sequence of n subsequent bits. The calculating apparatus establishes the best path from the state at the sampling instant $t_i$ having the lowest optimum path metric value, back in time towards the sampling instant $t_{i-N}$ via best predecessor states, established earlier for earlier sampling instants, to establish an optimum state at the sampling instant $t_{i-N}$. The calculating apparatus outputs at least one bit of the n bits of the sequence of bits corresponding to the established optimum state at the sampling instant $t_{i-N}$. The calculating apparatus also repeats the calculating, determining, establishing and outputting for a subsequent sampling instant $t_{i-N}$. The calculation apparatus obtains the optimum path metric value for the state at the sampling instant $t_i$ in the determining by: comparing the optimum path metric values of all possible predecessor states at the directly preceding instant $t_{i-N}$ of the state at the instant $t_i$, selecting the predecessor state at the directly preceding instant $t_{i-1}$ having the smallest optimum path metric value as the best predecessor state; and combining the optimum path metric value of the best predecessor state at the directly preceding sampling instant $t_{i-1}$ and a branch metric value corresponding to the state at the instant $t_i$, so as to obtain the optimum path metric value for the state, the branch metric value for the state being obtained from the sample value at the sampling instant and a reference amplitude, which reference amplitude has a relationship with the state.

The invention is based on the following recognition. With the apparatus in accordance with the invention as claimed in claim 1, the number of states have been decreased significantly. This results in a reduced complexity in the calculation for finding the most likely path in the corresponding finite state machine. With the apparatus in accordance with claim 6, the complexity is also reduced, for the reason that the add-compare-select strategy normally carried out in PRML detection systems has been replaced by a simpler compare-select-add strategy.

These and other aspects of the invention will become apparent from and will be elucidated further in the following figure description, in which

FIG. 10 shows in FIG. 10a a finite-state diagram of a 5-taps state detector for a d=3 channel code and in FIG. 10b the corresponding finite-state diagram of the 5-taps PRML state detector of FIG. 10a with reduced complexity, FIG. 11 shows in FIG. 11a a finite-state diagram of a 7-taps state detector for a d=3 channel code and in FIG. 11b the corresponding finite-state diagram of the 7-taps PRML state detector of FIG. 11a with reduced complexity.

A PRML bit detection apparatus with reduced complexity will be described. Partial-Response Maximum-Likelihood (PRML) detection is a candidate to replace the standard technique of Threshold Detection (TD) as used in CD and DVD-like systems. For the new DVR (digital video recorder) system, which is an optical recording/reproduction system, where a d=1 channel code is used, a 3-taps PRML detector has been proposed. Investigations have shown that an increase in the number of taps yields a markedly improved performance in terms of the bit-error-rate (BER). However, this implies also an increase in complexity of the Viterbi-trellis, which is linearly dependent on the number of states in the finite-state-machine (FSM) that is used for a n+1-taps PRML. The number of states $N_s$ amounts to 2 times $N_{d=1}(n)$ with $N_{d=1}(n)$ the Fibonacci numbers, i.e. the number of sequences of length n for a d=1 constraint.

The number $N_s$ of states and the number $N_B$ of branches connecting the states in the trellis diagram are shown in Table 1 for some choices of the number of taps. The main drawback of using a 5-taps PRML is its largely increased complexity (+167%) compared to a 3-taps PRML.

TABLE 1

Number of states ($N_s$) and number of branches ($N_B$) of the Finite-State-Machine (FSM) as a function of the number of taps of the PRML detector (for a d = 1 channel code).

| number of taps | $N_s$ | $N_B$ |
|---|---|---|
| 3 | 6 | 10 |
| 5-r.c. | 10 | 16 |
| 5 | 16 | 26 |

Figure 1:
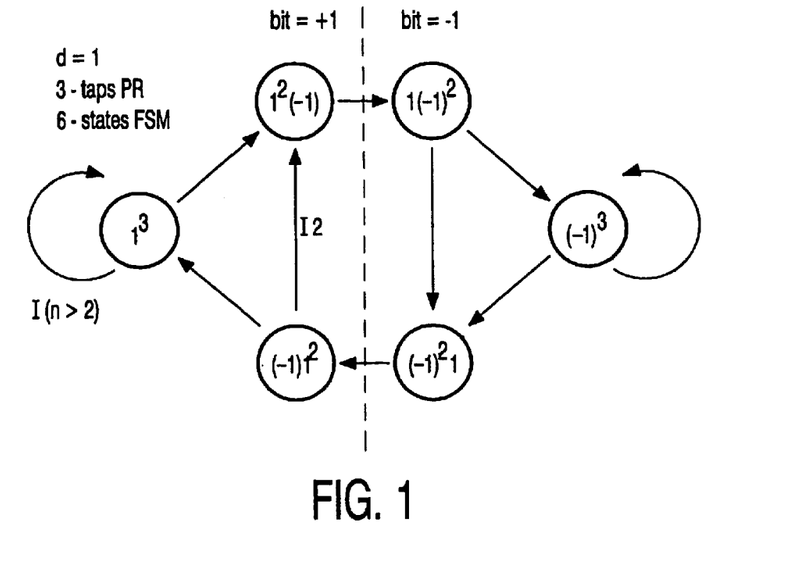
FIG. 1 shows a finite-state diagram of a 3-taps state detector for a d=1 channel code.
Figure 2:
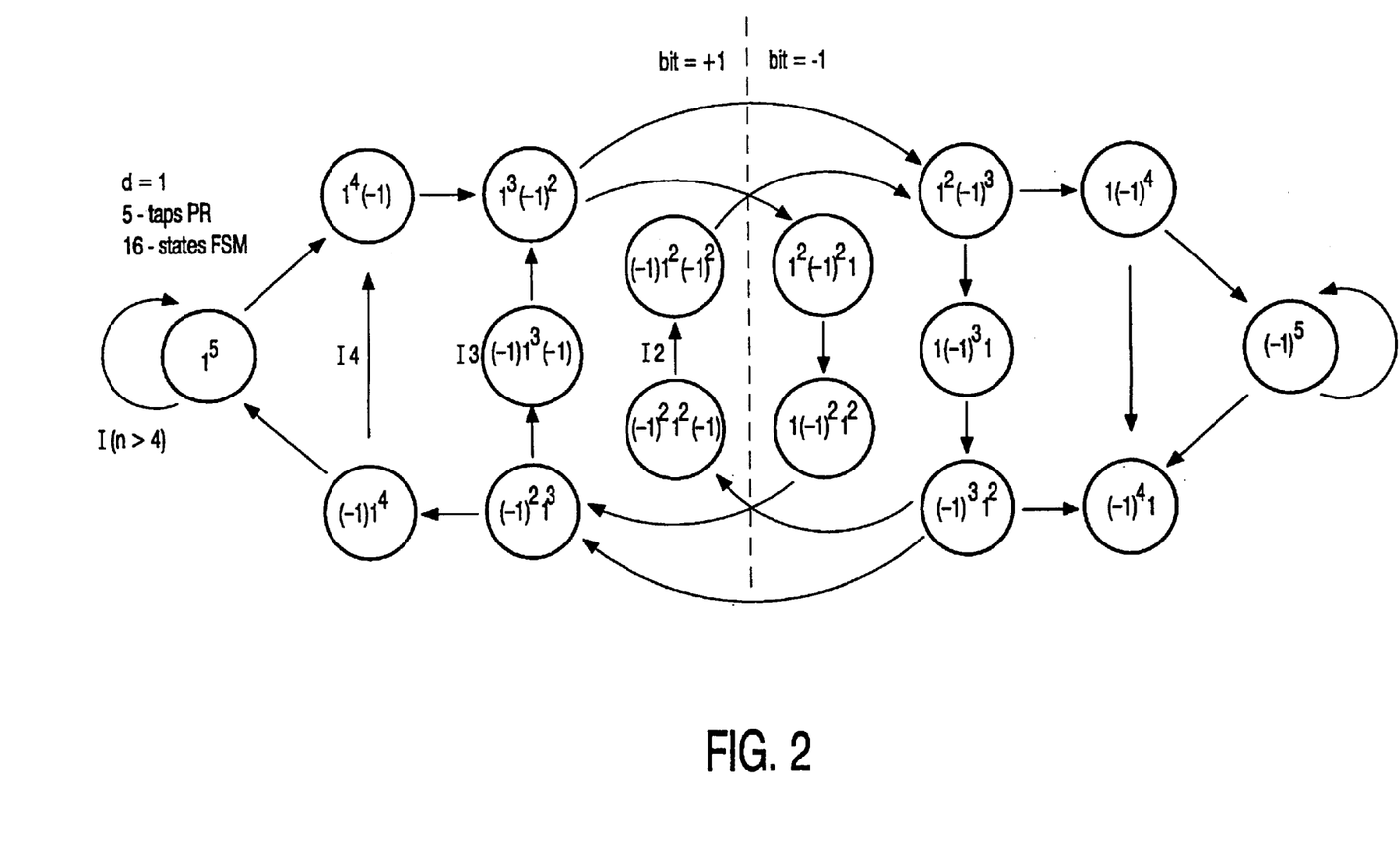
FIG. 2 shows a finite-state diagram of a 5-taps state detector for a d=1 channel code.
Figure 3:
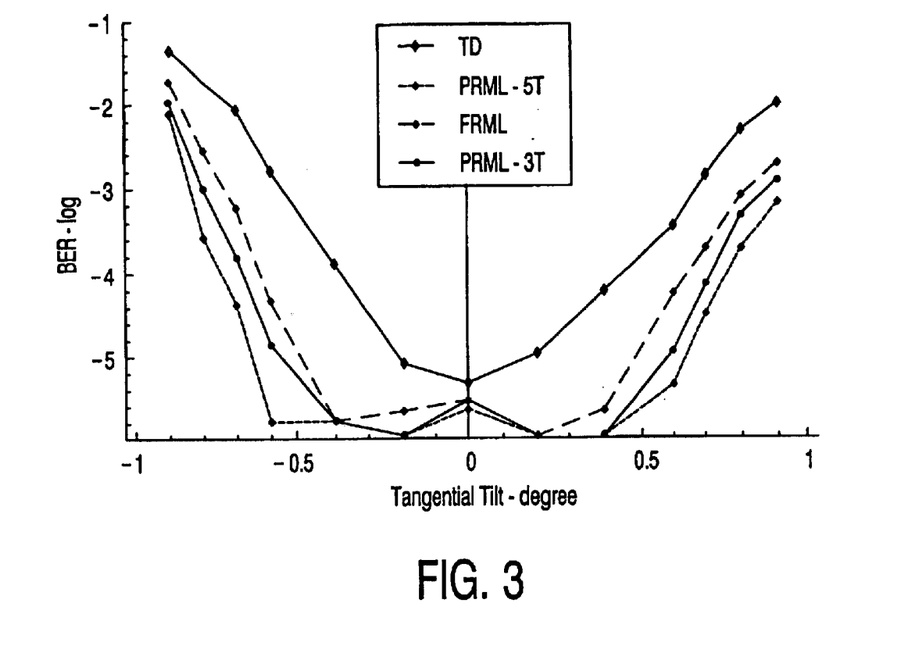
FIG. 3 shows the bit-error-rate (BER) as function of tangential disc tilt for phase-change recording, for 3-taps and 5-taps PRML, for Full-Response ML (FRML), also known as 'runlength push-back detection', and for Threshold Detection (TD)

The finite state diagrams for the 3-taps and 5-taps PRML are shown in FIGS. 1 and 2, respectively. FIG. 3 compares the performance in terms of bit-error-rate (BER) for a d=1 experiment for phase-change recording. The gain between 3-taps and 5-taps is due to differentiation for the short runlengths, i.e. I2 and I3. In the case of the 3-taps PRML, the first bits (or the last bits) of an I2 and an I3 are related to the same state; this implies that the same reference amplitude level is used upon computing the likelihood. In the case of the 5-taps PRML, the runs I2 and I3 follow separate paths through the finite state diagram so that the difference in amplitude level can be accounted for. For the 5-taps PRML, additional states are present in the finite state diagram which are related to the longer runs from I4 on; the 5-taps states $(-1)(1)_4$ and $(1)_4(-1)$ on the positive bit-side (+1), and the states $(1)_4(1)$ and $(1)(-1)_4$ on the negative bit-side (-1) are visited for the runs I4 and larger, the states $(1)_5$ and $(-1)_5$ are visited for the runs I5 and larger. For the 3-taps PRML, all the runs longer than I3 pass through the states $(1)_3$ or $(-1)_3$.

Figure 4:
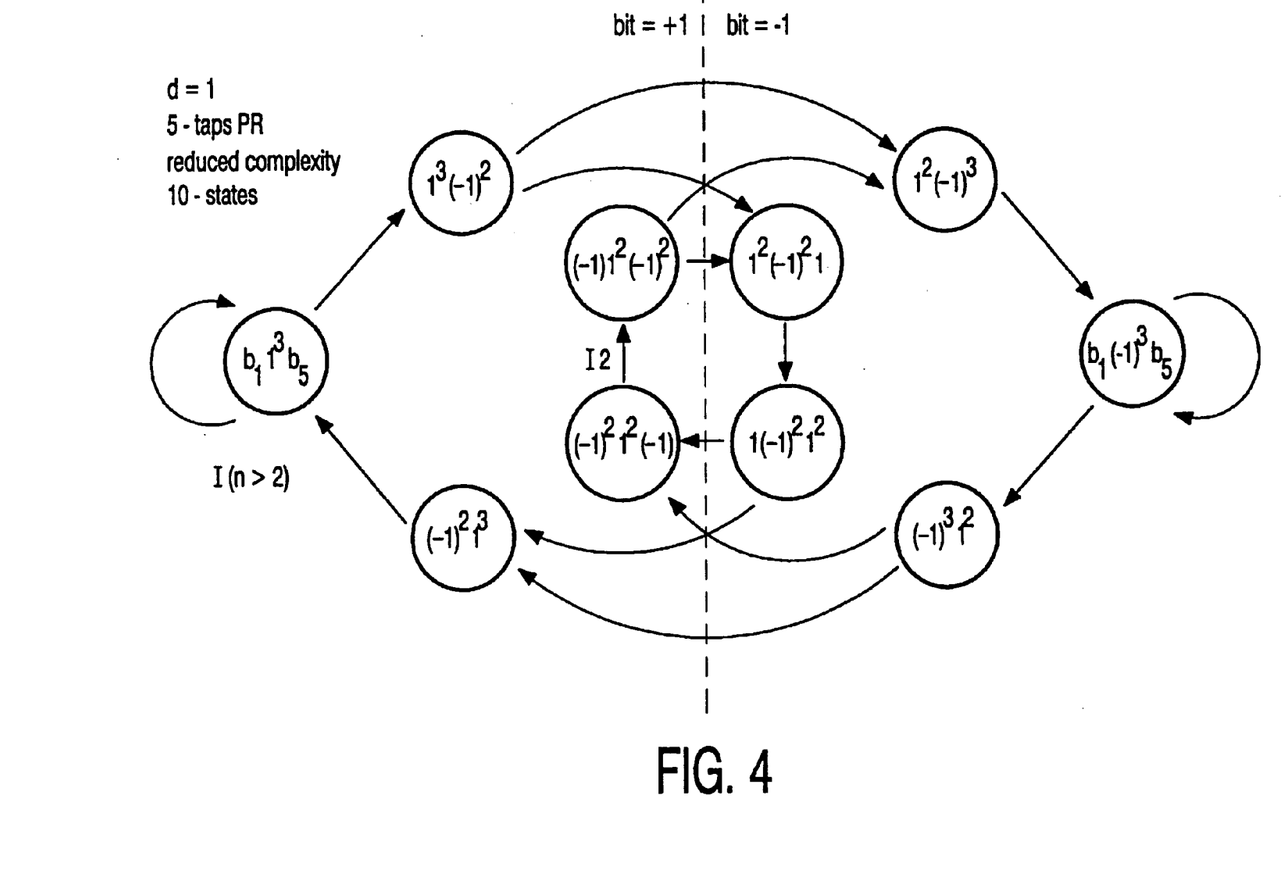
FIG. 4 shows a finite-state diagram of a 5-taps PRML state detector with reduced complexity for a d=1 channel code.
Figure 5:
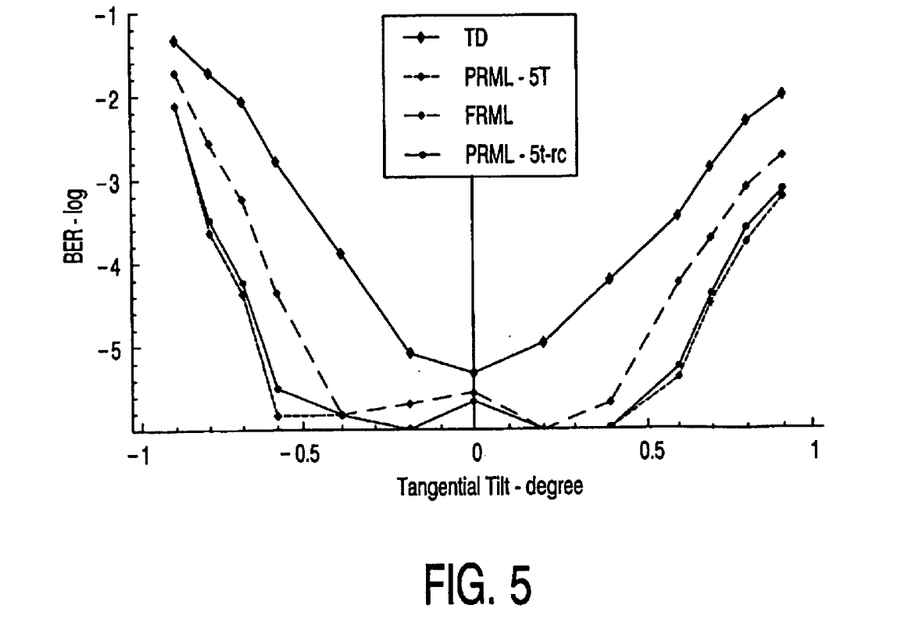
FIG. 5 shows the bit-error-rate (BER) as function of tangential disc tilt for phase-change recording, for 5-taps and 5-taps reduced-complexity (r.c.) PRML, for Full-Response ML (FRML), and for Threshold Detection (TD)

The gain between 3-taps and 5-taps is not due to the differentiation on the amplitude levels for the outer bits of the longer runlengths In (n≧3) so that the states $(-1)(1)_4$, $(1)_4(-1)$, $(1)_5$ and $(-1)(1)_3(-1)$ can be merged into a joint state $b_1(1)_3b_5$, with the first bit $b_1$ and the fifth bit $b_5$ can be either +1 or -1. The inner bits of a run are defined as all the bits in the run, except the two outer bits. In other words, for the inner bits of the longer runs (from I4 on), a 3-taps PRML might be sufficient. The merging of the 4 states into a single one (at both bit-sign sides) yields a reduced complexity in the finite state diagram, as shown in FIG. 4. The number of states now equals 10 instead of 16, as listed in Table 1. The performance of the 5-taps-r.c. (reduced complexity) detector is shown in FIG. 5; the performance loss compared to the full-fledged 5-taps detector is relatively small.

The main advantage of the 5-taps reduced complexity PRML is that it yields only a 67% increase in complexity compared to a 3-taps PRML, whereas the full-fledged 5-taps PRML requires an increase of 167% in complexity.

Figure 6:
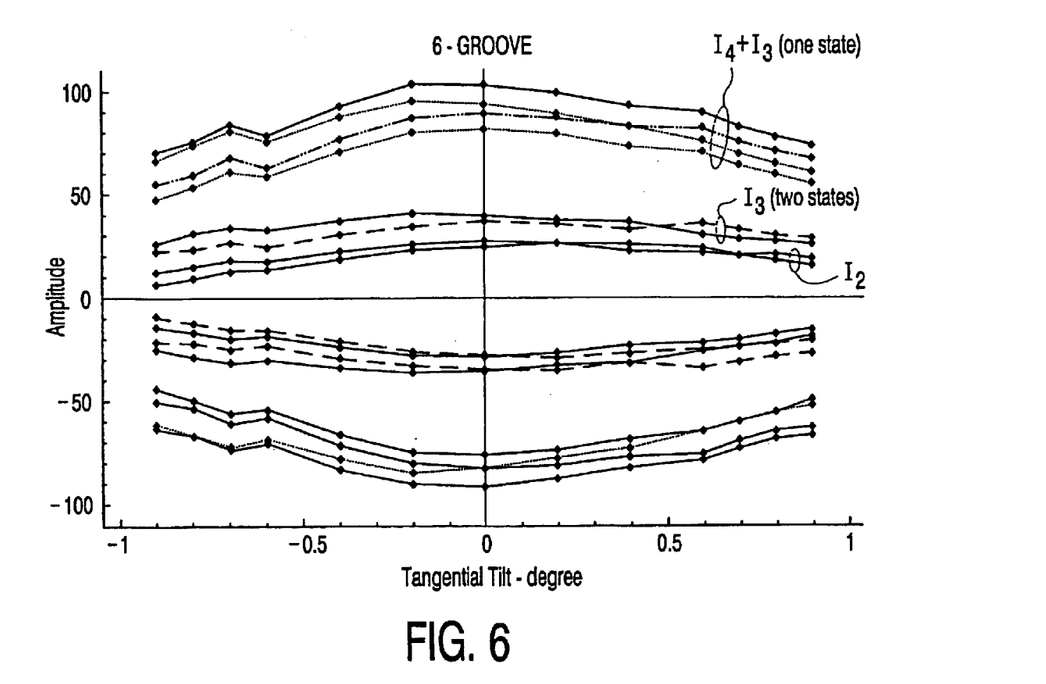
FIG. 6 shows the retrieved amplitudes for 5-taps PRML, as function of tangential tilt.

The amplitude levels retrieved in a phase-change optical recording experiment as a function of tangential tilt, are shown in FIG. 6 for a 5-taps PRML, using the linear averaging process described in the earlier filed EP patent application no. 98203146.0. The reduction in states for the 5-taps reduced complexity PRML consists in reducing the 4 upper and 4 lower levels into only two separate levels (actually, the ones with lowest absolute value of the amplitude). Those are the levels of the states $1_5$, $1_4(-1)$, $(-1)1_4$ and $(-1)1_3(-1)$ in FIG. 2, identified in FIG. 4 by the state $b_11_3b_5$, and the levels of the states $(-1)_5$, $1(-1)_4$, $(-1)_41$ and $1(-1)_31$ in FIG. 2, identified by the state $b_1(-1)_3b_5$ in FIG. 4. The levels corresponding with the shorter runs I2, via the states $(-1)1_2(-1)_2$ and $(-1)_21_2(-1)$ in FIGS. 2 and 4, and I3, via the states $1_3(-1)_2$ and $(-1)_21_3$ in FIGS. 2 and 4, are left intact.

Next, a description will be given of the functioning of a 'bit recursive' PRML detector. For simplicity reasons, in the following description it will be assumed that the window introduced below is (n=) 3 bits long. In accordance with the invention, however, n should be larger than 3, otherwise the basic principle of combining states is not applicable.

Figure 7:
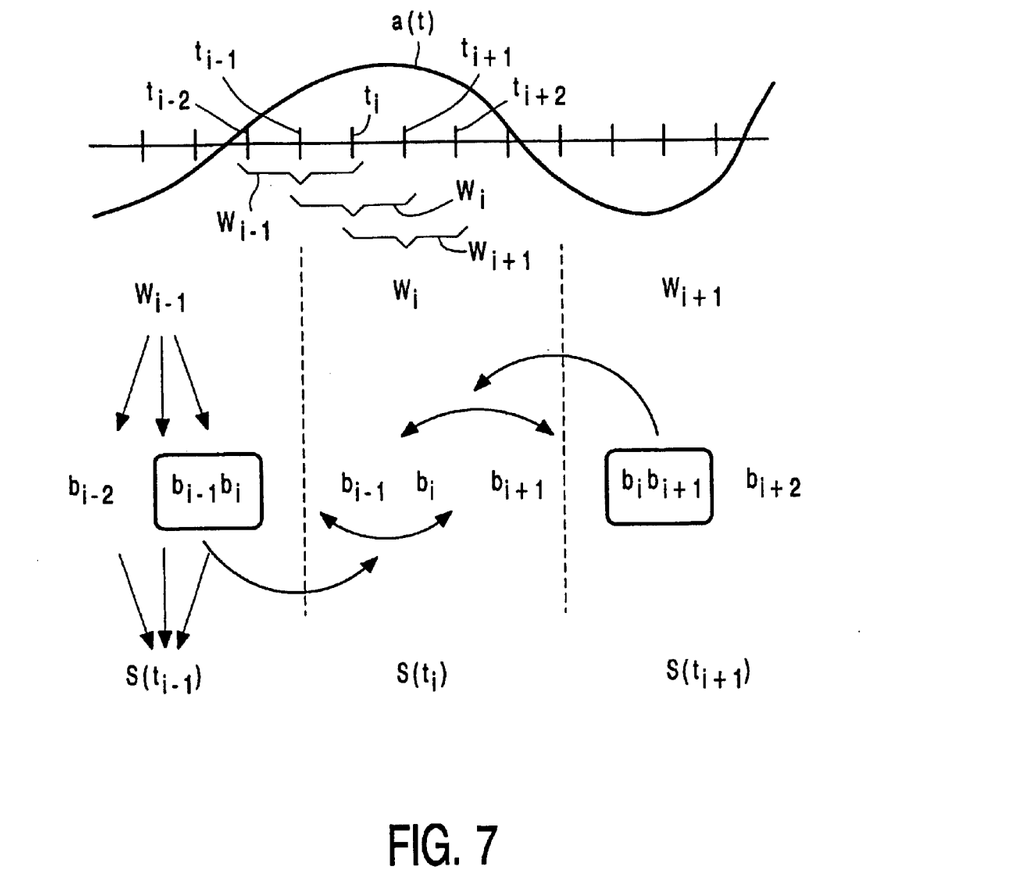
FIG. 7 shows the technique of PRML detection.

FIG. 7 shows a signal waveform a(t) from which a sequence of bits should be detected by a PRML detector. The signal waveform can be an analog input information signal or an oversampled digital signal. The signal waveform is sampled at sampling instants, given by the instants ..., $t_{i-2}$, $t_{i-1}$, $t_i$, $t_{i+1}$, $t_{i+2}$, ... in FIG. 7. The sampling instants are 'bit synchronous' or have a phase difference of 180° with respect to the bit locations in the signal. Windows ..., $w_{i-1}$, $w_i$, $w_{i+1}$, ... are shown indicating the subsequent n(=3, in the present example)-sample sequences that correspond to states of the finite state diagram of FIG. 1, in the present example. Those states are given by ..., $s(t_{i-1})$, $s(t_i)$, $s(t_{i+1})$, ... in FIG. 7. The states correspond to 3-bit bitsequences $b_{i-2}$, $b_{i-1}$, $b_i$ for the window $w_{i-1}$, $b_{i-1}$, $b_i$, $b_{i+1}$ for the window $w_i$, and $b_i$, $b_{i+1}$, $b_{i+2}$ for the window $w_{i+1}$, as shown in FIG. 7. Whilst for d=0, the number of possible states is 8, for d=1, the number of possible states is 6, as shown in FIG. 1.

Figure 8:
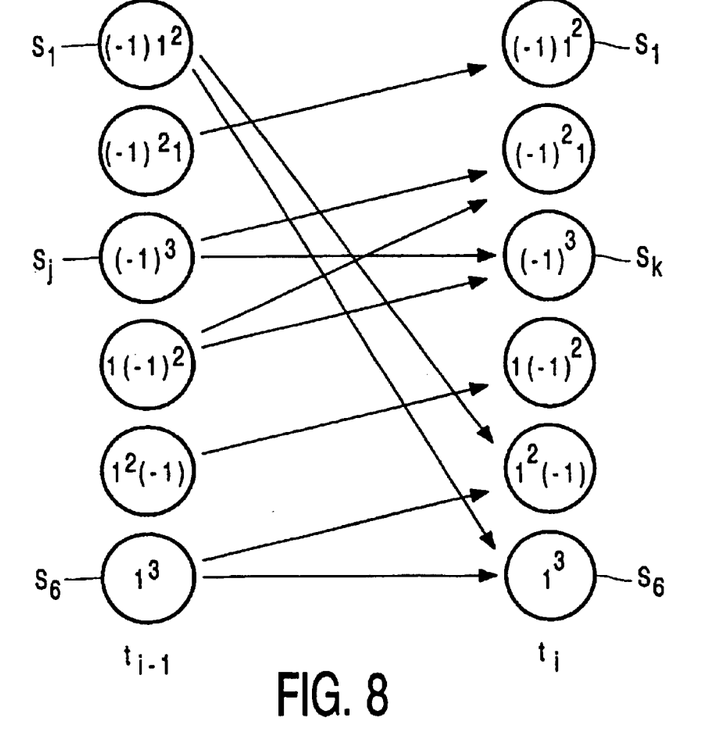
FIG. 8 shows again the finite state diagram of a 3-taps state detector for a d=1 channel code and the trellis diagram for this detector, FIG. 9 the various paths through the states.

Partial response detection on the sequence of samples shown in FIG. 7 is realized in the following way. FIG. 8 shows again the state transition diagram of FIG. 1 for the 3-taps partial response with d=1. FIG. 8 further shows the trellis diagram corresponding to the said response. The trellis diagram shows the transitions between the possible states for subsequent time instants $t_{i-1}$ and $t_i$.

PRML bit-detection in a Viterbi detector is based on finding the best path, back in time, through the trellis diagrams repeatedly for direct preceding time instants. This best path leads to a state at the time instant $t_{i-N}$, which state corresponds to a detected bit at said time instant $t_{i-N}$ and thereby yields a detected bit at said time instant $t_{i-N}$. Normally, the central bit of the n bit sequence, related to that state is taken to be the detected bit.

In the foregoing it is assumed that the sampling frequency substantially equals the bit frequency in the information signal. In some situations, it may be possible to subsample the information signal, eg. by a factor of two. Now, the 'back tracking' algorithm is performed at the pace of two bits. Now, the state at the time instant $t_{i-N}$ yields two detected bits at said time instant $t_{i-N}$.

The derivation of the best path can be realized by carrying out the following calculations. Assume that a path-cost or path-metric value $PM(s_j, t_{i-1})$ is known for each of the states $s_j$, at the time instant $t_{i-1}$, where j runs from 1 to 6 in FIG. 8. Further, assume that a best predecessor state $PS(s_j, t_{i-1})$ is available for each of the states $s_j$ at the time instant $t_{i-1}$. Now, a path-cost or path-metric $PM(s_j, t_i)$ can be calculated for each of the states $s_j$, at the time instant $t_i$, where j again runs from 1 to 6, in the following way:

For the transition from time instant $t_{i-1}$ to time instant $t_i$, a branch metric value $BM[s_j(t_{i-1}), s_k(t_i)]$ for each of the states s(k) at the time instant $t_i$ is computed. That means that, in the example of FIG. 8, the following branch metric values are calculated: $BM[s_1(t_{i-1}), s_5(t_i)]$, $BM[s_1(t_{i-1}), s_6(t_i)]$, $BM[s_2(t_{i-1}), s_1(t_i)]$, $BM[s_3(t_{i-1}), s_2(t_i)]$, $BM[s_3(t_{i-1}), s_3(t_i)]$, $BM[s_4(t_{i-1}), s_2(t_i)]$, $BM[s_4(t_{i-1}), s_3(t_i)]$, $BM[s_5(t_{i-1}), s_4(t_i)]$, $BM[s_6(t_{i-1}), s_5(t_i)]$ and $BM[s_6(t_{i-1}), s_6(t_i)]$.

More specifically, the branch metric value $BM[s_j(t_{i-1}), s_i(t_i)]$ can in the present example be calculated by means of one of the following formulas:

$$BM[s_j(t_{i-1}), s_k(t_i)] = \{a_i - A(s_k)\}_2$$

or $$BM[s_j(t_{i-1}), s_k(t_i)] = |a_i - A(s_k)|,$$

where $a_i$ is the sample value at the time instant $t_i$ and $A(s_k)$ is the amplitude value corresponding to the state $s_k$. The derivation of the amplitude values $A(s_k)$ has been extensively described in earlier filed EP patent application no. 98203146.0. For the structure of the finite state machine considered here, and as one can see from the above formula, the branch metric value $BM[s_j(t_{i-1}), s_k(t_i)]$ is independent of the state $s_j$ at the time instant $t_{i-1}$.

The six path metric values $PM(s_1, t_i)$ to $PM(s_6, t_i)$ can now be obtained in the following way.

$PM(s_1, t_i) = PM(s_2, t_{i-1}) + BM[s_2(t_{i-1}), s_1(t_i)]$. Further, the best predecessor state for state $s_1$ is (always) the state $s_2$.

$PM(s_4, t_i) = PM(s_5, t_{i-1}) + BM[s_4(t_{i-1}), s_5(t_i)]$. Further, the best predecessor state for state $s_4$ is (always) the state $s_5$.

two path metric values can be derived for state $s_2$, namely a first one defined as $PM_1(s_2, t_i) = PM(s_3, t_{i-1}) + BM[s_3(t_{i-1}), s_2(t_i)]$, and the second one defined as $PM_2(s_2, t_i) = PM(s_4, t_{i-1}) + BM[s_4(t_{i-1}), s_2(t_i)]$.

The two path metric values $PM_1(s_2, t_i)$ and $PM_2(s_2, t_i)$ are compared to each other and the smallest is chosen as the actual path metric value. Suppose this is $PM_2(s_2, t_i)$. Now, the best predecessor state for the state $s_2$ at the time instant $t_i$ is the state $s_4$.

two path metric values can be derived for state $s_3$, namely a first one defined as $PM_1(s_3, t_i) = PM(s_3, t_{i-1}) + BM[s_3(t_{i-1}), s_3(t_i)]$, and the second one defined as $PM_2(s_3, t_i) = PM(s_4, t_{i-1}) + BM[s_4(t_{i-1}), s_3(t_i)]$.

The two path metric values $PM_1(s_3, t_i)$ and $PM_2(s_3, t_i)$ are compared to each other and the smallest is chosen as the actual path metric value. Suppose this is $PM_1(s_3, t_i)$. Now, the best predecessor state for the state $s_3$ at the time instant $t_i$ is the state $s_3$.

two path metric values can be derived for state $s_5$, namely a first one defined as $PM_1(s_5, t_i) = PM(s_1, t_{i-1}) + BM[s_1(t_i), s5(t_i)]$, and the second one defined as $PM_2(s_5, t_i) = PM(s_6, t_{i-1}) + BM[s_6(t_{i-1}), s_5(t_i)]$.

The two path metric values $PM_1(s_5, t_i)$ and $PM_2(s_5, t_i)$ are compared to each other and the smallest is chosen as the actual path metric value. Suppose this is $PM_1(s_5, t_i)$. Now, the best predecessor state for the state $s_5$ at the time instant $t_i$ is the state $s_1$.

two path metric values can be derived for state $s_6$, namely a first one defined as $PM_1(s_6, t_i) = PM(s_1, t_{i-1}) + BM[s_1(t_i), s_6(t_i)]$, and the second one defined as $PM_2(s_6, t_i) = PM(s_6, t_{i-1}) + BM[s_6(t_{i-1}), s_6(t_i)]$.

The two path metric values $PM_1(s_6, t_i)$ and $PM_2(s_6, t_i)$ are compared to each other and the smallest is chosen as the actual path metric value. Suppose this is $PM_2(s_6, t_i)$. Now, the best predecessor state for the state $s_6$ at the time instant $t_i$ is the state $s_6$.

The above described calculation is carried out each time for subsequent time instants.

Figure 9A:
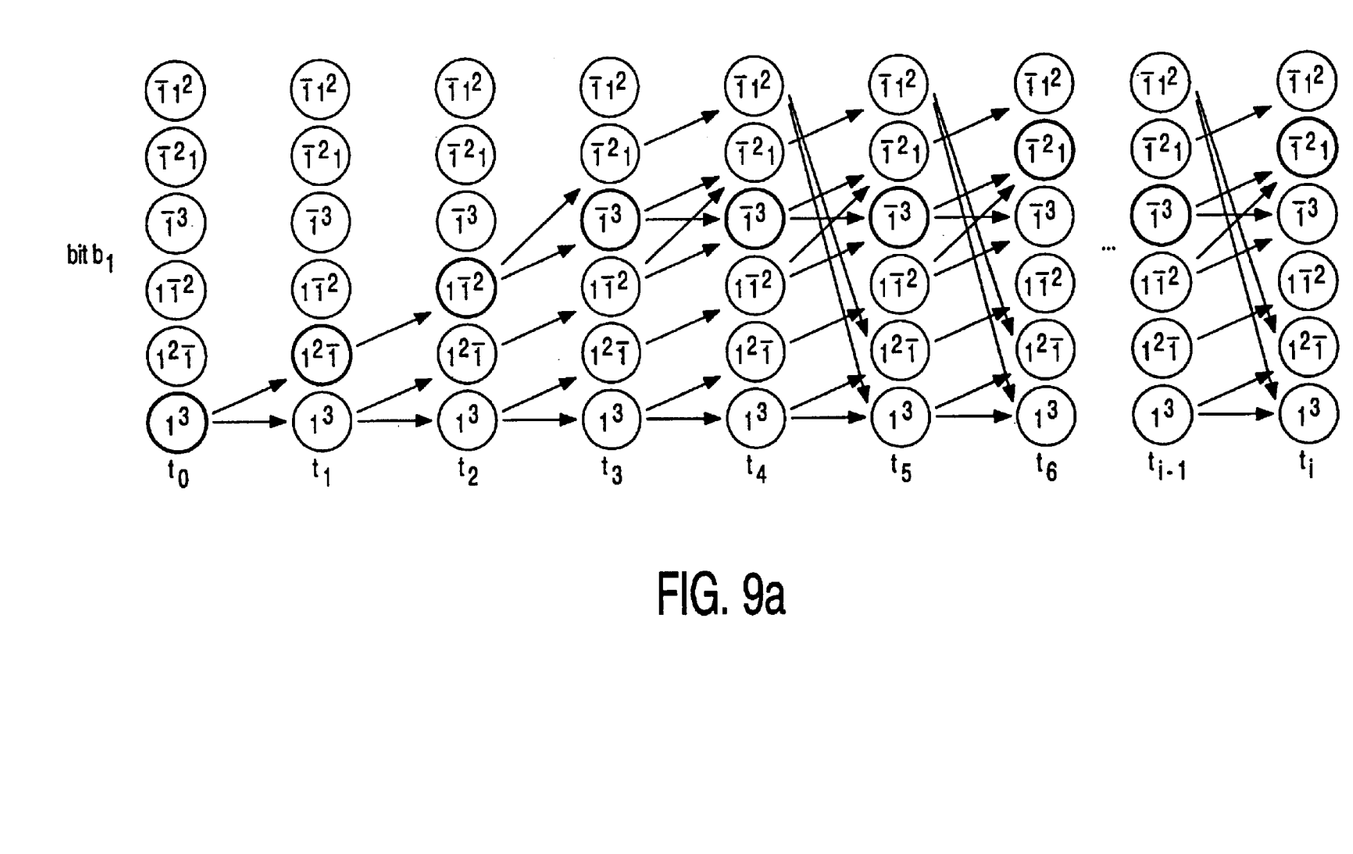
Figure 9B:
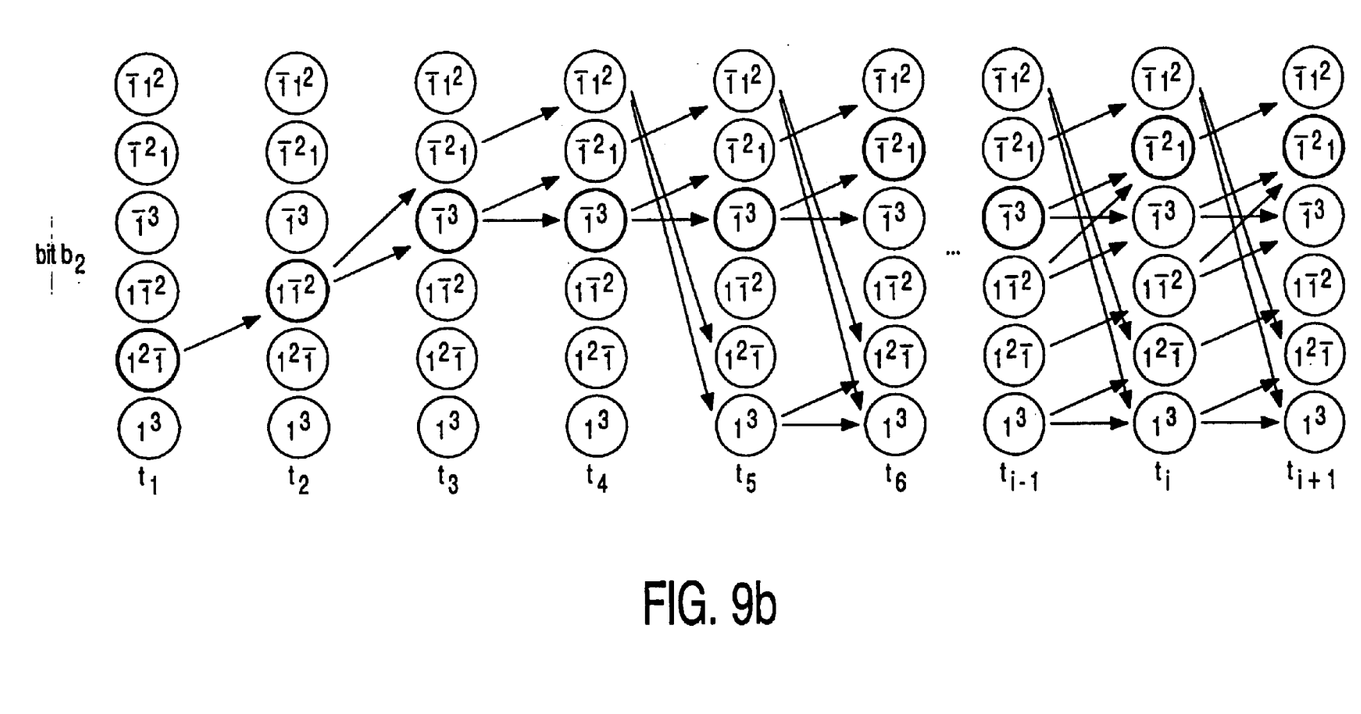
Figure 9C:
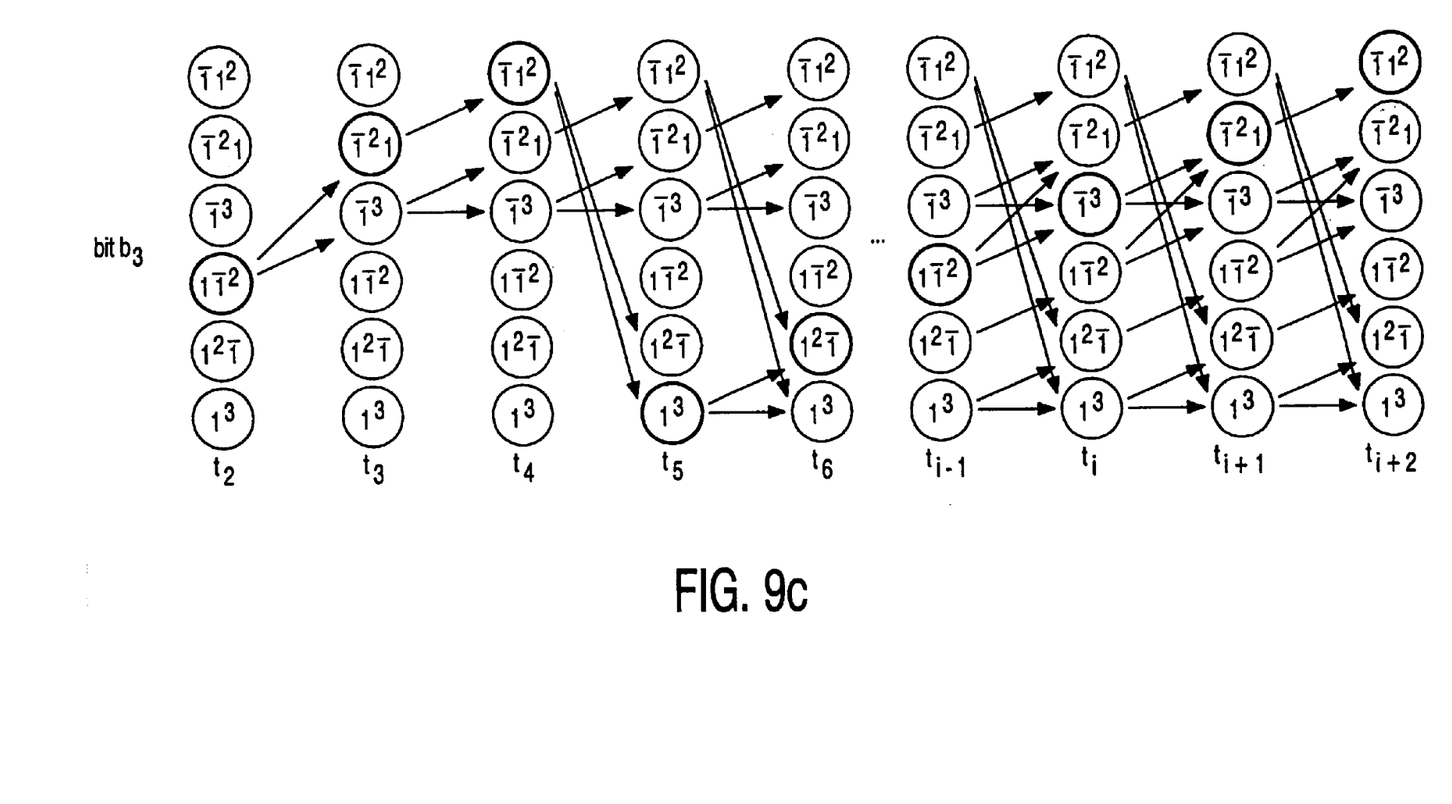

FIG. 9 shows the various possible paths through the states, for subsequent time instants. It will be assumed that the optimum state at the time instant $t_0$, is the state $1_3$. This state will thus be the result of applying the 'back tracking algorithm' at the time instant ti over N time instants, backwards in time, towards the time instant to, which is considered to be the starting point of the PRML algorithm. Suppose that the time interval between $t_i$ and to (that is the length of time covered by N time instants) is sufficiently long, so that the PRML detection can be considered to supply correctly detected bits. The first bit at the time instant to can now be derived in the following way.

The smallest of the path metric values $PM(s_1,t_i)$ to $PM(s_6, t_i)$ is established. Suppose this is the path metric value $PM(s_4,t_i)$. Now, a back tracking operation is carried out in backwards direction in time, going out from the state $s_4$, at the time instant $t_i$, via its corresponding best predecessor state, which is the state $s_5$ at the time instant $t_{i-1}$. Using the best predecessor state for the state $s_5$ at the time instant $t_{i-1}$, a state at the time instant $t_{i-2}$ can be found. This is continued until the time instant $t_{i-N}$ has been reached, which is the time instant $t_0$, so as to enable the detection of the first bit. It will turn out that at the time instant $t_0$, the path leads to the state $s_6$, so that the first bit detected, bit $b_1$, is a '1' bit, see FIG. 9a.

The above processing is again carried out when having calculated all the path metric values $PM(s_1,t_{i+1})$ to $PM(s_6, t_{i+1})$. The back tracking operation described above will now lead to the state $s_5$ at the time instant $t_2$, so that the bit $b_2$ equals a '1' bit, see FIG. 9b.

The above processing is again carried out when having calculated all the path metric values $PM(s_1,t_{i+2})$ to $PM(s_6, t_{i+2})$. The back tracking operation described above will now lead to the state $s_4$ at the time instant $t_3$, so that the bit $b_3$ equals a '0' bit, see FIG. 9c.

In the above described derivation of the path metric values, especially those for the states $s_2$, $s_3$, $s_5$ and $s_6$, an 'add-compare-select' method is used, namely, first, the branch metric value and the path metric value are added. This is done twice for the states mentioned. Next, both resulting path metric values $PM_1$ and $PM_2$ are compared to each other in order to determine the smallest one. However, as has been stated above, the branch metric values only depend on the final state. Therefore, a compare-select-add operation can be carried out, resulting in yet another reduction in complexity of the algorithm. One could namely first compare the path metric values of the possible predecessor states at the time instant $t_{i-1}$ (the states $s_1$ and $s_6$, when we are concerned with deriving the path metric value for the state $s_5$ at the time instant $t_i$), choose the smaller one and add the branch metric value to the path metric value chosen so as to obtain the path metric value for the state $s_5$.

Figure 10A:
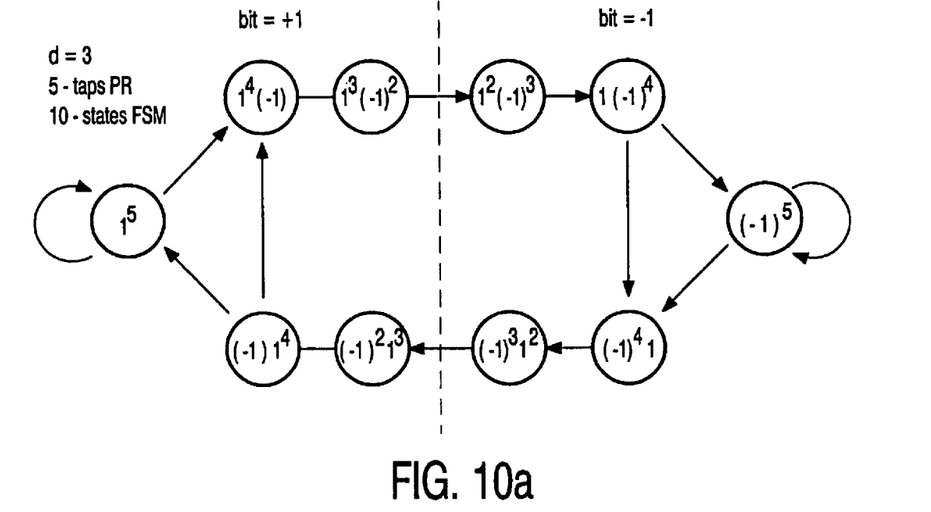
Figure 10B:
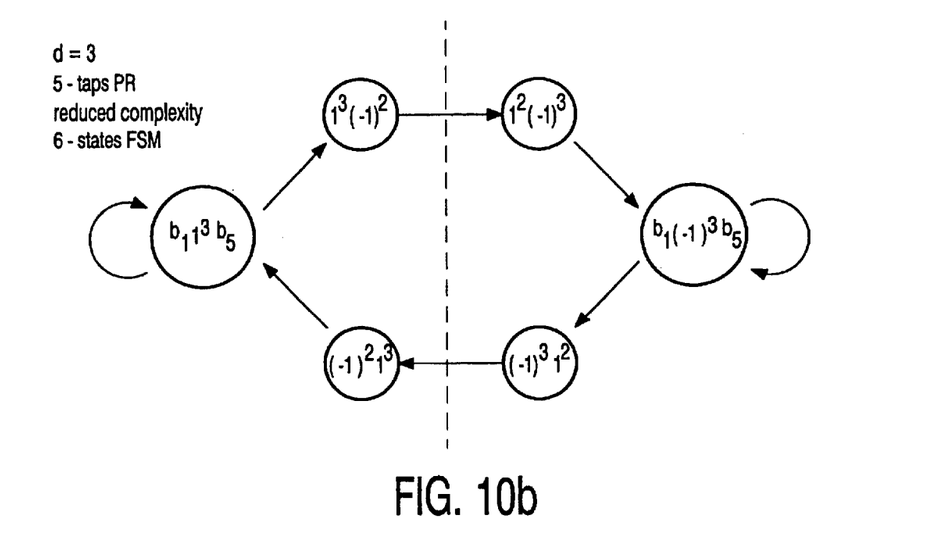

FIG. 10 shows the application of the invention in another embodiment. More specifically, FIG. 10a shows the finite state diagram for the 5-taps PRML where d equals 3. The state diagram shown in FIG. 10a has ten states in total. In accordance with the invention, the reduction in states for the 5-taps reduced complexity PRML of FIG. 10a consists in reducing the 3 upper and 3 lower levels into only two separate levels (actually, the ones with lowest absolute value of the amplitude). This results in the finite state diagram of FIG. 10b. Those levels are the levels of the states $1_5$, $1_4(-1)$ and $(-1)14$ in FIG. 10a, identified in FIG. 10b by the state $b_1 1_3 b_5$, and the levels of the states $(-1)_5$, $1(-1)_4$ and $(-1)_4 1$ in FIG. 10a, identified by the state $b_1(-1)_3 b_5$ in FIG. 10b.

Figure 11A:
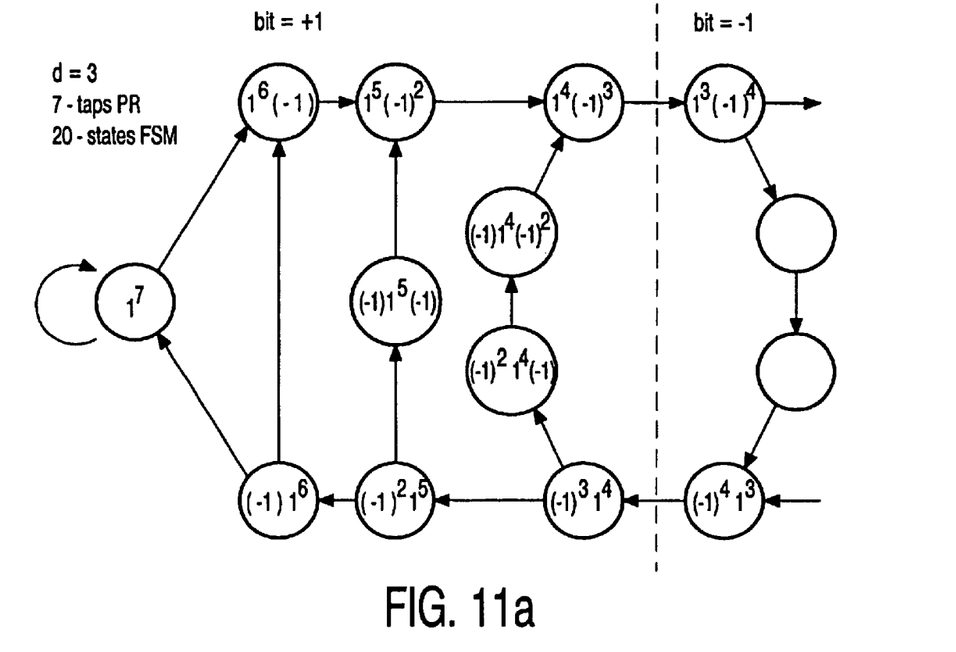
Figure 11B:
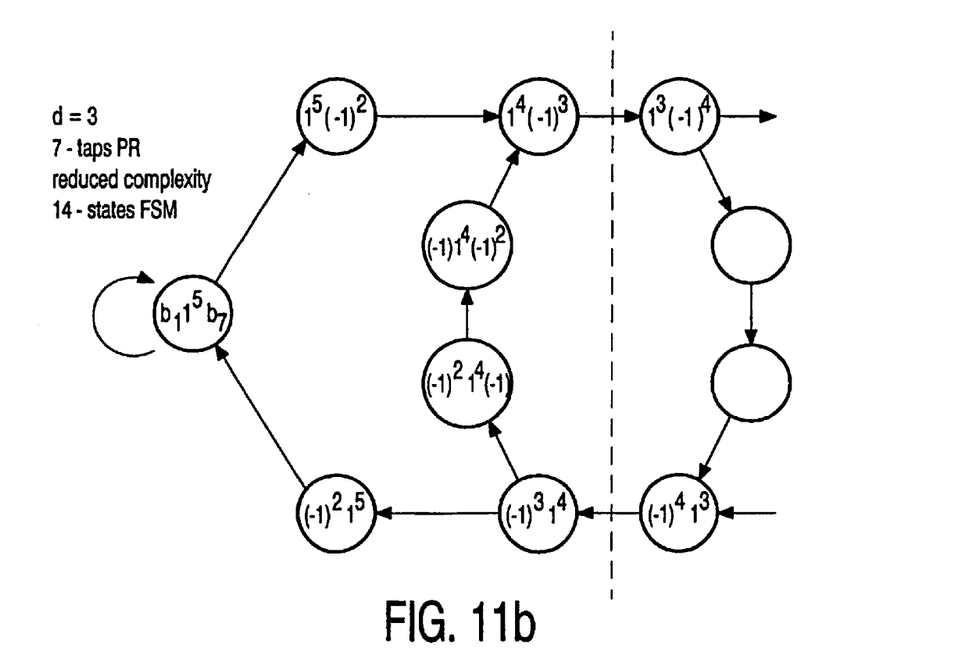

FIG. 11 shows the application of the invention in again another embodiment. More specifically, FIG. 11a shows the finite state diagram for the 7-taps PRML where d equals 3. The state diagram shown in FIG. 11a has 20 states in total. Not all of them are shown. It will be understood that the portion of the finite state diagram to the left of the vertical broken line in FIG. 11a should be, more or less 'mirror imaged' along this line in order to obtain the portion of the finite state diagram to the right of that line. In accordance with the invention, the reduction in states for the 7-taps reduced complexity PRML of FIG. 11a consists in reducing the 4 upper and 4 lower levels into only two separate levels (actually, the ones with lowest absolute value of the amplitude). This results in the finite state diagram of FIG. 11b. Those levels are the levels of the states $1_7$, $1_6(-1)$, $(-1)1_6$ and $(-1)1_5(-1)$ in FIG. 1a, identified in FIG. 10b by the state $b_1 1_5 b_7$, and the corresponding levels of the states $(-1)_7$, $1(-1)_6$, $(-1)_6 1$ and $1(-1)_5 1$, not shown in FIG. 11a, which should be identified by a combined state $b_1(-1)_5 b_7$ in FIG. 11b.

Figure 12:
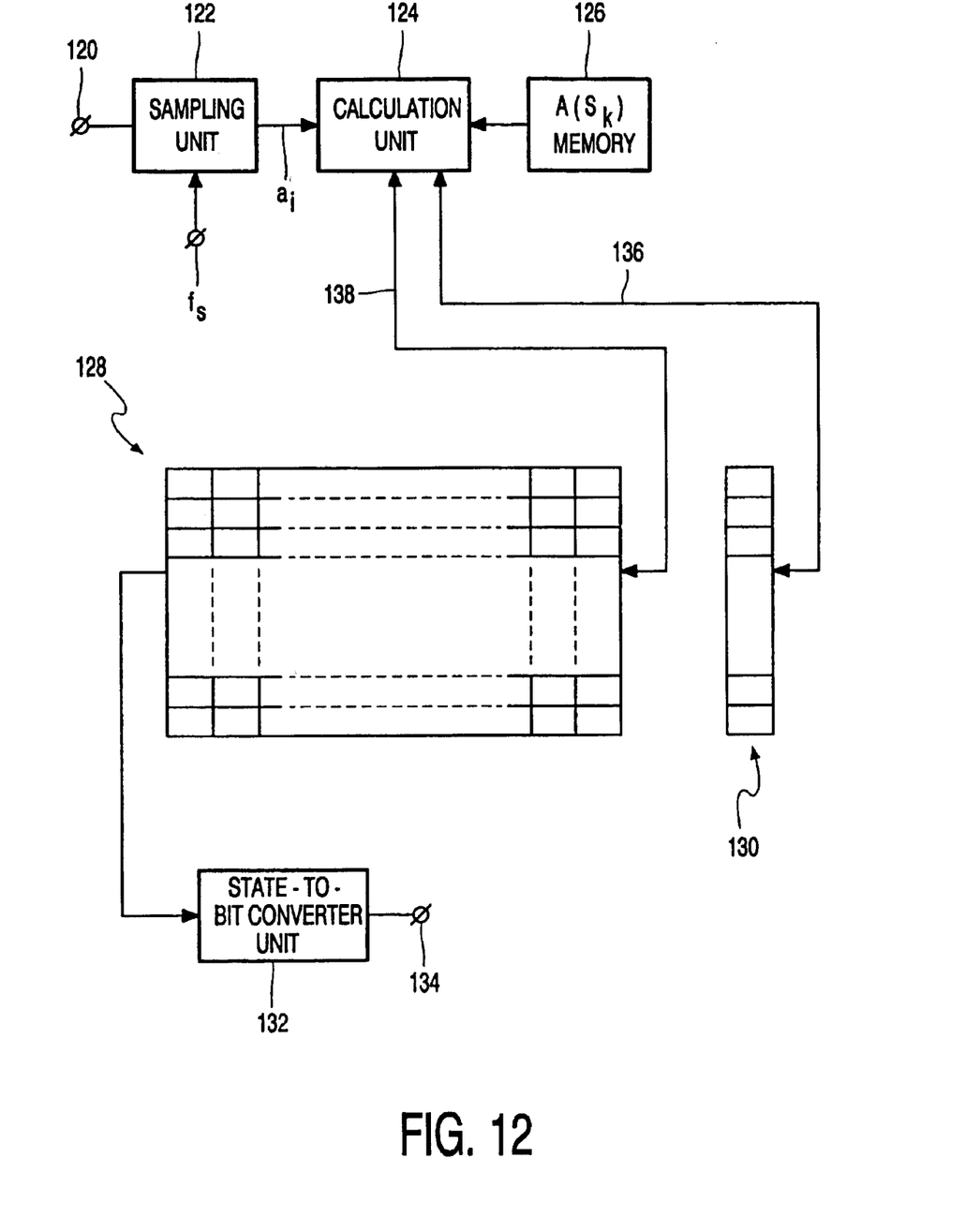
FIG. 12 shows an embodiment of the PRML apparatus.

FIG. 12 shows an embodiment of the PRML detection apparatus in accordance with the invention. The apparatus has an input 120 for receiving the information signal, which is coupled to an input of a sampling unit 122. The sampling unit 122 samples the information signal with a sampling frequency $f_s$, resulting in sample values $a_i$ at sampling instants $t_i$ that are supplied to a calculation unit 124. The apparatus further comprises a memory unit 126 in which the reference amplitudes $A(s_k)$, one for each of the states $s_k$, are stored. The apparatus further comprises a memory unit 128 in which vectors are stored, one for each of the states, and one for a plurality of previous time instants. A vector for a state $s_k$ at a time instant $t_i$ is indicative of the best predecessor state for the said state at the directly preceding time instant $t_{i-1}$. The vectors of all possible states $s_k$ at the time instant $t_i$ are stored in a vertical column in the memory unit 128. Further, there are N columns in the memory unit 128.

The apparatus further comprises a path metric value memory unit 130, having as many storage locations as there are possible states $s_k$ in the 'reduced complexity' finite state diagram. Each location has a path metric value stored for a state $s_k$ at the time instant $t_i$. The memory unit 128 has a coupling to the calculation unit 124 via the connection 138. The memory unit 130 has a coupling to the calculation unit 124 via the connection 136. The memory unit 128 further has an output coupled to a state-to-bit converter unit 132, which has an output coupled to the output terminal 134 of the apparatus.

The functioning of the apparatus is as follows. Upon supplying a new sample value $a_i$ by the sampling unit 122 to the calculation unit 124, the calculation unit 124 retrieves the $A(s_k)$ values from the memory 126 and the calculation unit 124 calculates the branch metric values in the way as explained above. Next, the calculation unit 124 calculates the path metric values $PM(s_k,t_i)$ in the way as explained above. That is: one path metric value for each of the states $s_k$, using the path metric values $PM(s_k,t_{i-1})$ stored in the memory unit 130, for the previous time instant $t_{i-1}$. The path metric values $PM(sk,t_i)$ obtained are stored in the memory unit 130, over the old path metric values, as the new path metric values for the time instant ti. Further, vectors, one vector for each of the states $s_k$, are derived, indicating the best predecessor state at the time instant $t_{i-1}$. Upon shifting the contents in all the rows in the memory unit 128 over one position to the left, the most right column in the memory unit becomes available for receiving the vectors for the states $s_k$. Those vectors are supplied via the line 138 to the memory unit 128 and stored in the most right column.

The calculation unit further comprises a comparator (not shown) for comparing the path metric values $PM(s_k,t_i)$, to determine the smallest one. This leads to one of the states at the time instant $t_i$, which state is the first state in the 'back tracking algorithm', using the vectors stored in the memory 128. The 'back tracking algorithm' results in pointing to one of the states using a vector in the most left column of the memory 128. An indicator signal indicating said state is supplied to the converter unit 132, which generates a bit (or two bits) in response to the state selected.

The above algorithm is repeated for subsequent sample values supplied to the calculation unit 124, resulting in a sequence of bits at the output terminal 134.

Whilst the invention has been described with reference to preferred embodiments thereof, it is to be understood that these are not limitative examples. Thus, various modifications may become apparent to those skilled in the art, without departing from the scope of the invention, as defined by the claims. As an example, when comparing the FIGS. 2 and 4, one sees that in the embodiment described, all states having three central '1's have been combined into one state and all states having three central '−1's have been combined into one state. However, one could have chosen otherwise, such as combining all states having four '1's in the 5-bit sequence into one state and combining all states having four '−1's into one state.

As a second example, when comparing the FIGS. 11a and 11b, one sees that in the embodiment described, all states having five central '1's have been combined into one state and all states having five central '−1's have been combined into one state. However, one could have chosen otherwise, such as combining all states having six '1's in the 7-bit sequence into one state and combining all states having six '−1's into one state.

Further, any reference signs do not limit the scope of the claims. The invention can be implemented by means of both hardware and software, and several "means" may be represented by the same item of hardware. The word 'comprising' does not exclude the—presence of other elements or steps than those listed in a claim. Also, the word "a" or "an" preceding an element does not exclude the presence of a plurality of such elements. In addition, the invention lies in each and every novel feature or combination of features.

What is claimed is:

1. A partial response maximum likelihood bit detection apparatus for deriving a bit sequence from an input information signal, comprising:
   an input for receiving the input information signal;
   a sampling unit for sampling the input information signal at sampling instants so as to obtain sample values of the input information signal at the sampling instants; and
   means for calculating, determining, establishing, outputting and repeating;
   the calculating includes calculating at a sampling instant for each of a plurality of states at the sampling instant, an optimum path metric value
   the determining includes determining for each of the plurality of states, a best predecessor state at the directly preceding sampling instant, a state at the sampling instant identifying a sequence of n subsequent bits, where n is larger than 3, and sequences of n subsequent bits having n 1 directly successive bits of the same binary value are allocated to the same state;
   the establishing includes establishing the best path from the state at the sampling instant having the lowest optimum path metric value, back in time towards a previous sampling instant via best predecessor states, established earlier or earlier sampling instants, to establish an optimum state at the previous sampling instant;
   the outputting includes outputting at least one bit of the n bits of the sequence of bits corresponding to the established optimum state at the previous sampling instant; and
   the repeating includes repeating the calculating, determining, establishing and outputting for a subsequent sampling instant.

2. The apparatus of claim 1, wherein n is an even number.

3. The apparatus of claim 1, wherein n is an odd number larger than 4, and that sequences of n subsequent bits having n−2 directly successive bits of the same binary value as the central n−2 bits in such n-bit sequence, are allocated to the same state.

4. The apparatus of claim 3, wherein n−5.

5. The apparatus of claim 1, wherein the optimum path metric value for a state is obtained by combining the optimum path metric value of the best predecessor state at the directly preceding sampling instant and a branch metric value corresponding to the state, the branch metric value for the state being obtained from the sample value at the sampling instant and a reference amplitude, which reference amplitude has a relationship with the state.

6. The detection apparatus of claim 1 wherein, the previous sampling instant is approximately n/2 sampling instants previous to the current sampling instant.

7. A partial response maximum likelihood bit detection apparatus for deriving a bit sequence from an input information signal, comprising
   input means for receiving the input information signal;
   sampling means for sampling the input information signal at sampling instants so as to obtain sample values of the input information signal at the sampling instants; and
   means for calculating, determining, establishing, outputting and repeating:
   the calculating includes calculating at the sampling instant for each of a plurality of states at the sampling instant, an optimum path metric value;
   the determining includes determining for each of the plurality of states, a best predecessor state at the directly preceding sampling instant, a state at the sampling instant identifying a sequence of n subsequent bits;
   the establishing includes establishing the best path from the state at the sampling instant having the lowest optimum path metric value, back in time towards a previous sampling instant via best predecessor states, established earlier for earlier sampling instants, to establish an optimum state at the previous sampling instant; and
   the outputting includes outputting at least one bit of the n bits of the sequence of bits corresponding to the established optimum state at the previous sampling instant;
   the repeating includes repeating the calculating, determining, establishing and outputting for a subsequent sampling instant;
   and wherein the optimum path metric value for the state at the sampling instant is obtained by:
   comparing the optimum path metric values of all possible predecessor states at the directly preceding instant of the state at the sampling instant;
   selecting the predecessor state at the directly preceding instant having the smallest optimum path metric value as the best predecessor state; and
   combining the optimum path metric value of the best predecessor state at the directly preceding sampling instant and a branch metric value corresponding to the state at the sampling instant, so as to obtain the optimum path metric value for the state, the branch metric value for the state being obtained from the sample value at the sampling instant and a reference amplitude, which reference amplitude has a relationship with the state.

8. The apparatus of claim 7, wherein n is larger than 3, and sequences of n subsequent bits having n−1 directly successive bits of the same binary value are allocated to the same state.

9. A method of partial response maximum likelihood bit detection comprising:
receiving the input information signal;
sampling, the input information signal at sampling instants so as to obtain sample values of the input information signal at the sampling instants;
calculating at the sampling instant for each of a plurality of states at the sampling instant, an optimum path metric value,
determining for each of the plurality of states, a best predecessor state at the directly preceding sampling instant, a state at the sampling instant identifying a sequence of n subsequent bits, where n is larger than 3, and sequences of n subsequent bits having n−1 directly successive bits of the same binary value are allocated to the same state;
establishing the best path from the state at the sampling instant having the lowest optimum path metric value, back in time towards a previous sampling instant via best predecessor states, established earlier for earlier sampling instants, to establish an optimum state at the previous sampling instant;
outputting at least one bit of the n bits of the sequence of bits corresponding to the established optimum state at the previous sampling instant; and
repeating the calculating, determining, establishing and outputting for a subsequent sampling instant.

10. A method of partial response maximum likelihood bit detection comprising:
receiving the input information signal;
sampling, the input information signal at sampling instants so as to obtain sample values of the input information signal at the sampling instants,
calculating at the sampling instant for each of a plurality of states at the sampling instant, an optimum path metric value;
determining for each of the plurality of states, a best predecessor state at the directly preceding sampling instant, a state at the sampling instant identifying a sequence of n subsequent bits;
establishing the best path from the state at the sampling instant having the lowest optimum path metric value, back in time towards a previous sampling instant via best predecessor states, established earlier for earlier sampling instants, to establish an optimum state at the previous sampling instant; and
outputting at least one bit of the n bits of the sequence of bits corresponding to the established optimum state at the previous sampling instant;
repeating the calculating, determining, establishing and outputting for a subsequent sampling instant;
and wherein the optimum path metric value for the state at the sampling instant is obtained by:
comparing the optimum path metric values of all possible predecessor states at the directly preceding instant of the state at the instant;
selecting the predecessor state at the directly preceding instant having the smallest optimum path metric value as the best predecessor state; and
combining the optimum path metric value of the best predecessor state at the directly preceding sampling instant and a branch metric value corresponding to the state at the instant, so as to obtain the optimum path metric value for the state, the branch metric value for the state being obtained from the sample value at the sampling instant and a reference amplitude, which reference amplitude has a relationship with the state.

11. A partial-response maximum-likelihood bit detection apparatus for deriving a bit sequence from an input information signal, comprising:
an input for receiving the input information signal;
a sampling unit, for sampling the input information signal at multiple sampling instants so as to obtain respective sample values of the input information signal at the sampling instants; and
a partial response maximum likelihood calculation unit, the calculation unit deriving the bit sequence from the multiple sample values;
the calculating unit calculates respective optimum path metric values for each of a plurality of states at the current sampling instant;
the calculating unit determines a respective best predecessor state at the directly preceding sampling instant for each of the plurality of states, a state at the current sampling instant identifying a sequence of n subsequent bits;
the calculating unit establishes the best path from the state at the sampling instant having the lowest optimum path metric value, back in time towards a previous sampling instant via best predecessor states established earlier for earlier sampling instants, to establish an optimum state at the previous sampling instant;
the calculating unit outputs at least one bit of the n bits of the bit sequence, the bit corresponding to the established optimum state at the previous sampling instant;
and wherein the calculating unit includes means for allocating sequences of n subsequent bits, having n−1 directly successive bits of the same binary value, to the same state.

12. A partial response maximum likelihood bit detection apparatus for deriving a digital bit sequence from an input information signal, comprising:
an input for receiving the input information signal;
a sampling unit for sampling the input information signal at multiple sampling instants so as to obtain respective sample values of the amplitude of the input information signal at the sampling instants; and
a partial response maximum likelihood calculation unit adapted to derive the bit sequence from the multiple sample values;
the calculating unit calculates respective optimum path metric values for each of a plurality of states at the current sampling instant;
the calculating unit determines a respective best predecessor state at the directly preceding sampling instant for each of the plurality of states, a state at a sampling instant identifying a sequence of n subsequent bits;
the calculating unit establishes the best path from the state at the current sampling instant back in time towards a previous sampling instant via best predecessor states established earlier for earlier sampling instants in order to establish an optimum state at the previous sampling instant, the best state having the lowest optimum path metric value;
the calculating unit outputs at least one bit of the n bits of the bit sequence, the bit corresponding to the established optimum state at the previous sampling instant;

and wherein the calculating unit includes means for:

comparing the optimum path metric values of all possible predecessor states at the directly preceding instant of the state at the sampling instant;

selecting the predecessor state at the directly preceding instant having the smallest optimum path metric value as the best predecessor state; and combining the optimum path metric value of the best predecessor state at the directly preceding sampling instant and a branch metric value corresponding to the state at the sampling instant, so as to obtain the optimum path metric value for the state, the branch metric value for the state being obtained from the sample value at the sampling instant and a reference amplitude, which reference amplitude has a relationship with the state.

13. A partial response maximum likelihood bit detection apparatus for deriving a bit sequence from an input information signal, comprising:

input (120) for receiving the input information signal;

sampling unit (122) for sampling the information signal at a constant sampling frequency $f_s$ resulting in sample amplitude values $a_1$ at respective sampling time instants $t_1$;

a first portion (126) of memory for storing reference amplitude values $A(s_k)$ for each state $s_k$ of K states;

a second portion (128) of memory for storing a repsective vector $V(s_k, t_i)$ for each of the K states for each sampling instant of N sequential sampling instants, the vector for a state for a sampling instant indicates the best predecessor state for that state at the directly preceding sampling instant;

a third portion (130) of memory for storing a respective best path metric value B–PM($s_k$, $t_i$) for each of the K states at each of the N sampling instants;

a calculation unit (124) for determining bits of the bit sequence in response to a current amplitude sample value $a_I$ at a current sampling instant $t_I$, the determining including: calculating for each state $s_k$ and each other state $s_j$, branch metric values BM[$s_j(t_{I-1}),s_k(t_I)$] for the state $s_k$, the branch metric values for the state $s_k$ depending on the current amplitude sample value $a_I$ and the reference amplitude value $A(s_k)$ for the state; calculating for each state $s_k$ path metric values PM($s_k,t_i$) for the state, each of the K path metric values for the state depending on a respective branch metric value for a state of the directly preceding sampling instant and a best path metric value stored in the third memory portion for a respective state of the directly preceding sampling instant; for each state, comparing the K path metric values PM($s_k,t_i$) for the state and choosing a best path metric value B–PM($s_k,t_I$) for the state from among the K path metric values PM($s_k,t_i$) for the state; storing the best path metric values chosen for each state for the current sampling instant and storing a respective vector $V(s_k)$ for each state for the current sampling instant, the vector indicating the state of the immediately previous sample used to calculate the best path metric for the state of the current sampling instant; comparing the K best path metric values for the respetive states for the current sampling instant and choosing a best of the best path metric value BB–PM($t_I$) from among the best path metric values for the current sampling instant; and determining one or more bits of the bit sequence by following the vectors from the best of the best path metric value for the current sample $a_I$ back N samples to one of the best path metric values for a previous sample $a_{I-N}$ at a previous instant $t_{1-N}$;

and wherein N is larger than 3 and K is related to N.

* * * * *